United States Patent

Shinohara

[11] Patent Number: 5,574,682
[45] Date of Patent: Nov. 12, 1996

[54] PC CARD

[75] Inventor: Takayuki Shinohara, Itami, Japan

[73] Assignee: Mitsubishi Denki Kabushiki Kaisha, Tokyo, Japan

[21] Appl. No.: 537,005

[22] Filed: Oct. 2, 1995

[30] Foreign Application Priority Data

Apr. 27, 1995 [JP] Japan .................................. 7-104259

[51] Int. Cl.⁶ ............................. G11C 11/50; G11C 8/00; G06F 3/00
[52] U.S. Cl. ............... 365/164; 365/230.06; 365/230.08; 395/500
[58] Field of Search ............................. 365/164, 230.06, 365/230.08; 395/500

[56] References Cited

U.S. PATENT DOCUMENTS 5,519,851  5/1996  Bender et al. ........................ 395/500

OTHER PUBLICATIONS

"PC Card Standard", PCMCIA/JEIDA, vol. 3, 1995.

Primary Examiner—David C. Nelms
Assistant Examiner—Trong Phan
Attorney, Agent, or Firm—Leydig, Voit & Mayer

[57] ABSTRACT

A PC card comprising a housing having side surfaces and a connector surface communicating with the side surfaces, contact holes mated with contact pins of a multipin connector and contact pins of a standard pin connector alike and formed on the connector surface, and additional contact holes mated with the contact pins of the multipin connector and formed on the contact surface. The PC card is usable for and interchangeable between a personal computer having a standard pin connector.

16 Claims, 17 Drawing Sheets

FIG. 13
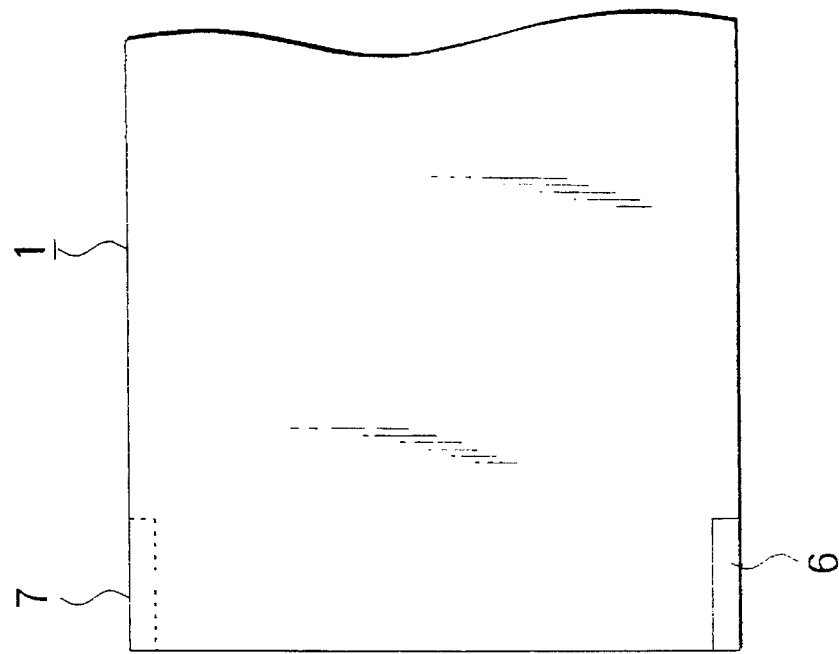
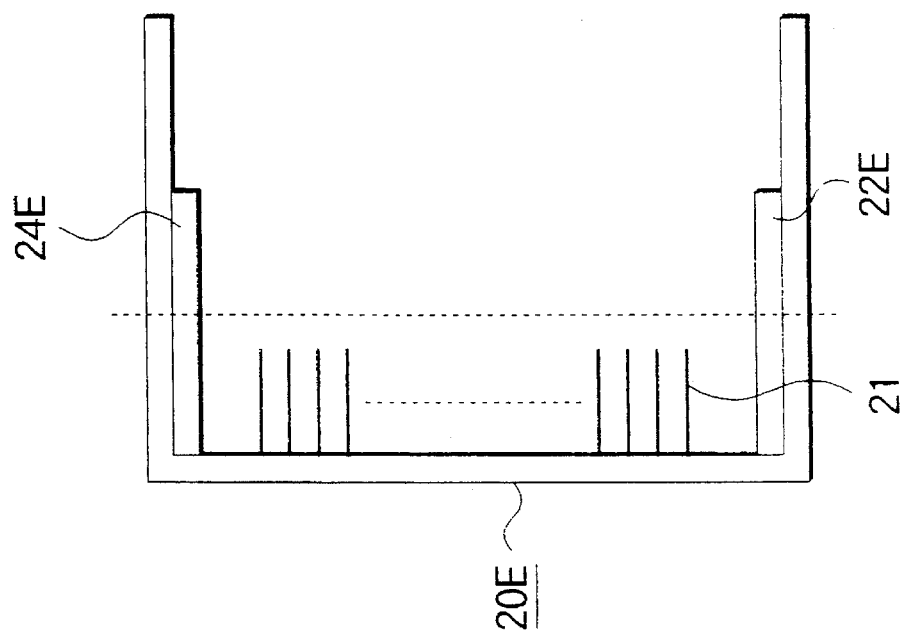

PC CARD

BACKGROUND OF THE INVENTION

1. Field of the Invention

The present invention relates to a PC card (this is a generic name referring to a memory card and an I/O card alike) usable in conjunction with electronic equipment including pin connectors that have different numbers of contact pins, such as, a personal computer, workstation, and multifunction telephone set.

2. Description of the Related Art

Referring to FIGS. 14, 15, 16, and 17, the structure of a known PC card will be described below. FIG. 14 is a perspective view illustrating a known PC card. FIG. 15 is a front view showing a connector surface of the known PC card. FIG. 16 is a block diagram showing the circuitry of the known PC card. FIG. 17 is a perspective view showing a known pin connector of a personal computer that is coupled with the known PC card.

In FIGS. 14 and 15, a known PC card 1 has 68 contact holes 5 formed in two rows (34 holes each) on a contact surface 2 of a socket (not shown) of the PC card 1, an incorrect insertion prevention ditch 6 formed on one side surface 3 of the housing of the PC card 1, and an incorrect insertion prevention ditch 7 formed on the other side surface 4 of the housing and shaped differently than the incorrect insertion prevention ditch 6.

In FIG. 16, the known PC card 1 includes circuitry comprising a control input port 10 connected to any of the contact holes 5, an address input port 11 connected to any of the contact holes 5, a mode control circuit 12 for controlling read and write modes, an address decoder 13 for selecting any of the chips constituting a semiconductor memory device that will be described later, an address input buffer 14 for inputting an address, a semiconductor memory device 15 consisting of a plurality of chips and having, for example, a storage capacity of 64 megabytes, a data input/output buffer 16 for inputting and outputting data, and a data input/output port 17 connected to any of the contact holes 5.

In FIG. 17, a known pin connector (standard pin connector) 20 has 68 contact pins lined up in two rows, an incorrect insertion prevention jut 22, and another incorrect insertion prevention jut (not shown).

The currently-prevailing standard specifications for the known PC card 1 are described in the PC Card Standard issued by the Personal Computer Memory Card International Association (PCMCIA) and the Japan Electronic Industry Development Association (JEIDA). This standard stipulates physical and electrical specifications for the PC card 1 using a 68-pin two-piece type connector. According to ongoing specifications for the PC card 1, the number of pins is limited to 68, therefore a maximum size for address space and a maximum transfer rate are 64 megabytes (A0 to A25) and 16 bits (D0 to D15) respectively. The configuration of the 68 pins (holes) is determined under the specifications: 26 pins are used as address pins (holes); 16 pins are used as data pins (holes), the remaining pins are used as control pins (holes) and power pins (holes).

The mode control circuit 12 controls the semiconductor memory device 15 and data input/output buffer 16 according to a read/write mode signal sent via the control input port 10, and places them in the read or write mode. The address input buffer 14 inputs an address (A0 to A25) via the address input port 11. The address decoder 13 outputs a chip select signal indicating any of the chips constituting the semiconductor memory device 15 to the semiconductor memory device 15 according to the high-order bits of the input address. The data input/output buffer 16 reads data (D0 to D15) from the semiconductor memory device 15 into a personal computer or writes data (D0 to D15) from the personal computer into the semiconductor memory device 15. Currently, semiconductor memory devices to be mounted in PC cards include larger storage capacities and personal computers accessing the PC cards are offering higher operating speeds. Accordingly, there is an increasing demand for a PC card having a large address space and/or permitting a higher transfer rate.

As far as the aforesaid known PC card is concerned, since the number of pins is limited, when a semiconductor memory device to be mounted has a larger capacity or a personal computer accessing the semiconductor memory device offers a higher operating speed, the PC card cannot be adapted.

SUMMARY OF THE INVENTION

The present invention attempts to solve the foregoing problems. An object of the present invention is to provide a PC card having a larger address space, offering a higher transfer rate, and being adaptable for a semiconductor memory device having a larger storage capacity and for a personal computer, which accesses the semiconductor memory device, permitting a higher operating speed.

A PC card in accordance with the present invention comprises a housing having side surfaces and a connector surface communicating with the side surfaces, first contact holes mated with contact pins of a multipin connector and contact pins of a standard pin connector alike and formed in said connector surface, and second contact holes mated with said contact pins of said multipin connector and formed in said connector surface.

The FC card can therefore be used for and interchangeable between a personal computer having a multipin connector and a personal computer having a standard pin connector.

A PC card in accordance with the present invention has incorrect insertion prevention ditches which are larger than incorrect insertion prevention ditches of a PC card that can be coupled with said standard pin connector alone, and which are formed in said side surfaces of the housing.

Damage to the pins of a multipin connector due to incorrect insertion of the known PC card may be prevented by use of the present invention.

A PC card in accordance with the present invention includes an offset circuit for allotting a memory area for standard pin mode to any portion of a memory area for multipin mode.

The PC card can therefore be used for a conventional personal computer having a standard pin connector.

BRIEF DESCRIPTION OF THE DRAWINGS

FIG. 13 is a plan view showing a pin connector of a personal computer to be coupled with the PC card in accordance with the fifth embodiment of the present invention and a known PC card;

DESCRIPTION OF THE PREFERRED EMBODIMENTS

First Embodiment

Figure 1:
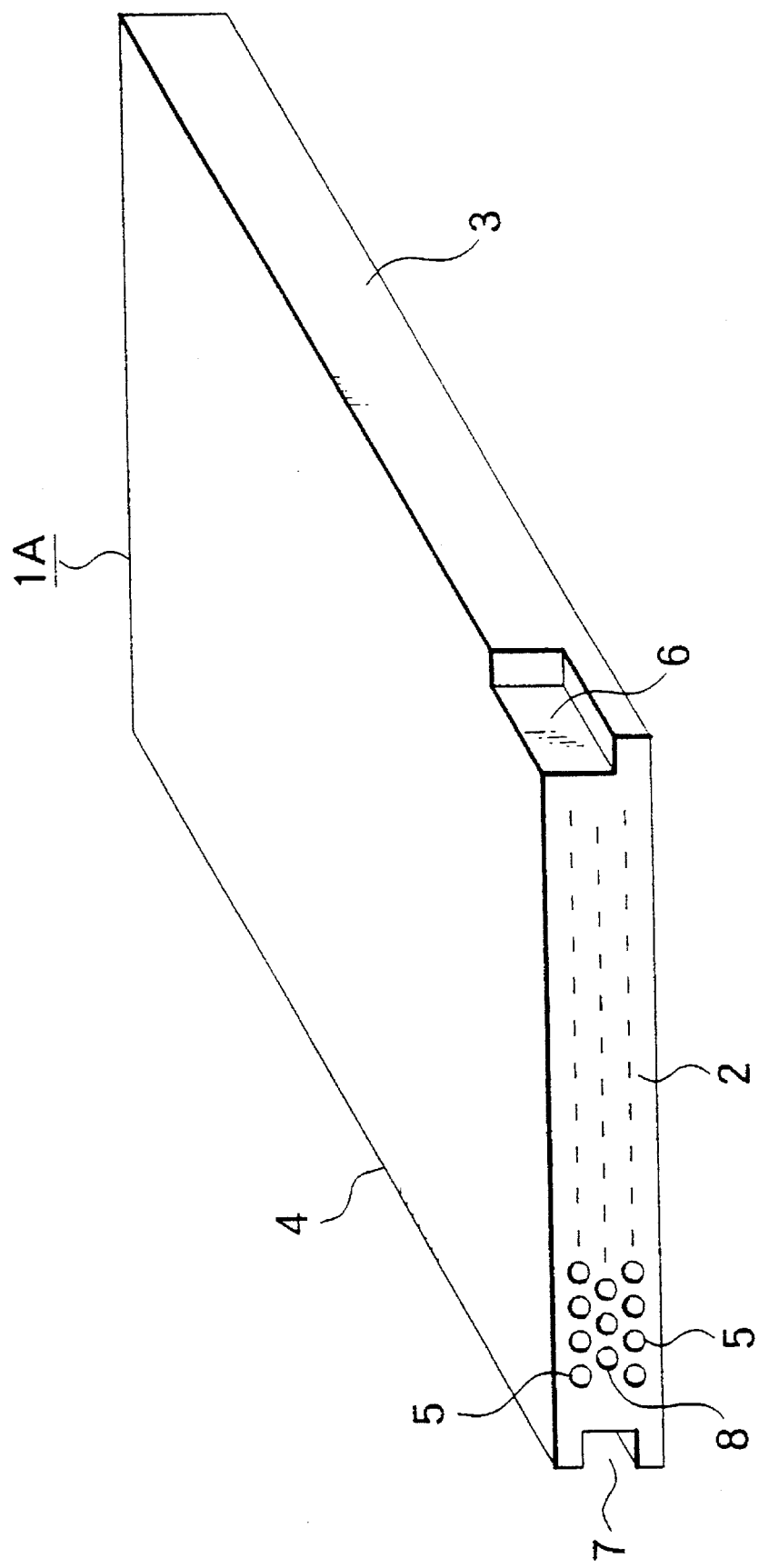
FIG. 1 is a perspective view showing a PC card in accordance with the first embodiment of the present invention.
Figure 2:
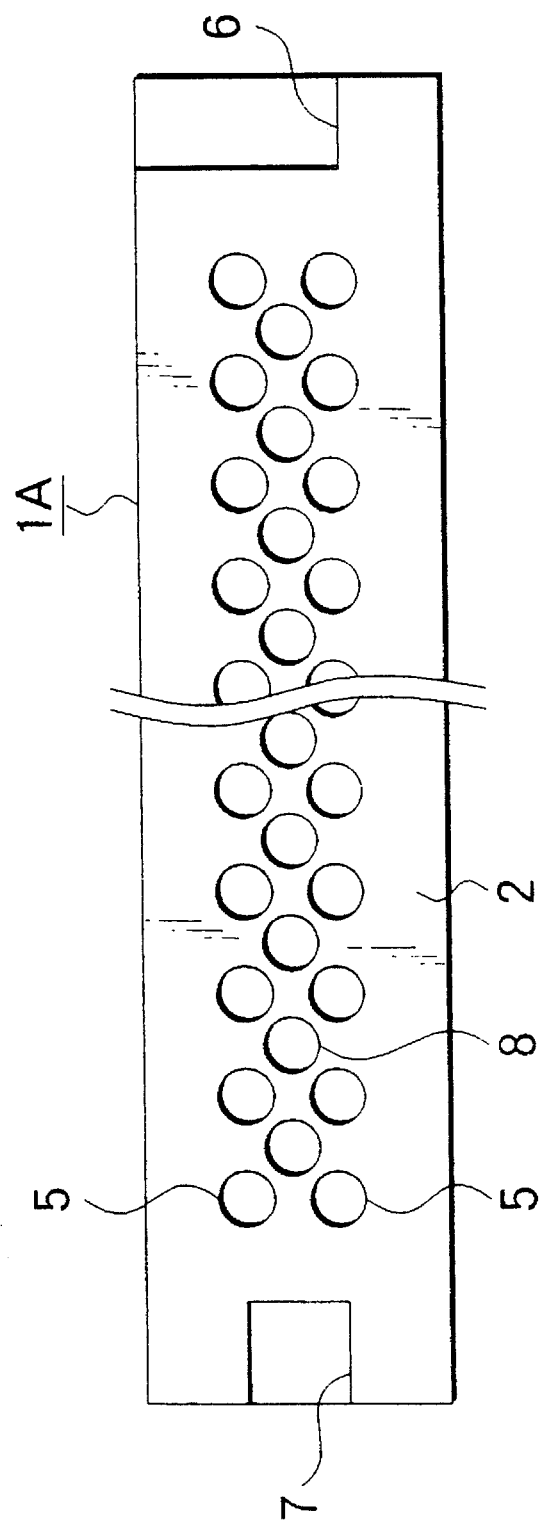
FIG. 2 is a front view showing a connector surface of the PC card in accordance with the first embodiment of the present invention.
Figure 3:
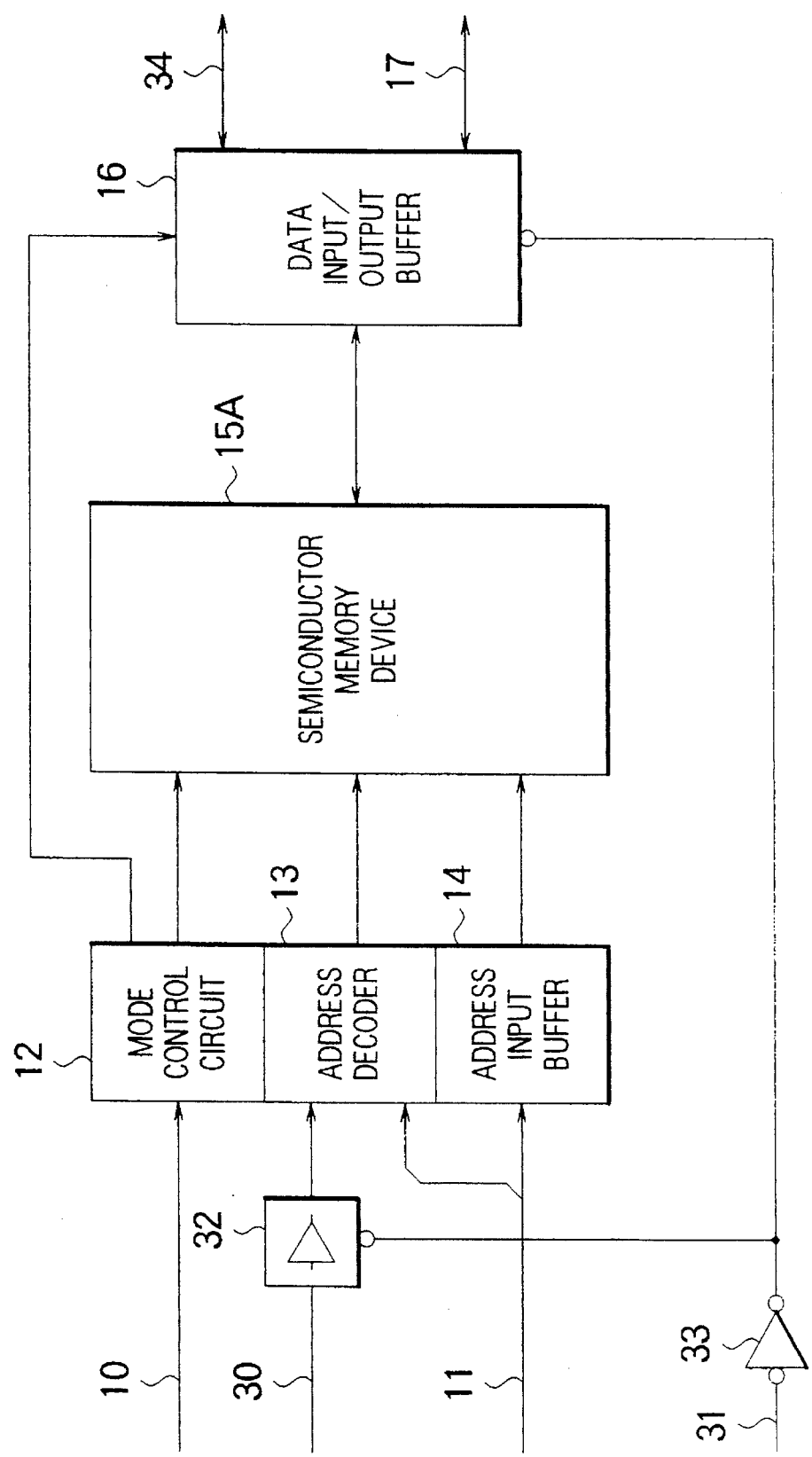
FIG. 3 is a block diagram showing the circuitry of the PC card in accordance with the first embodiment of the present invention.
Figure 4:
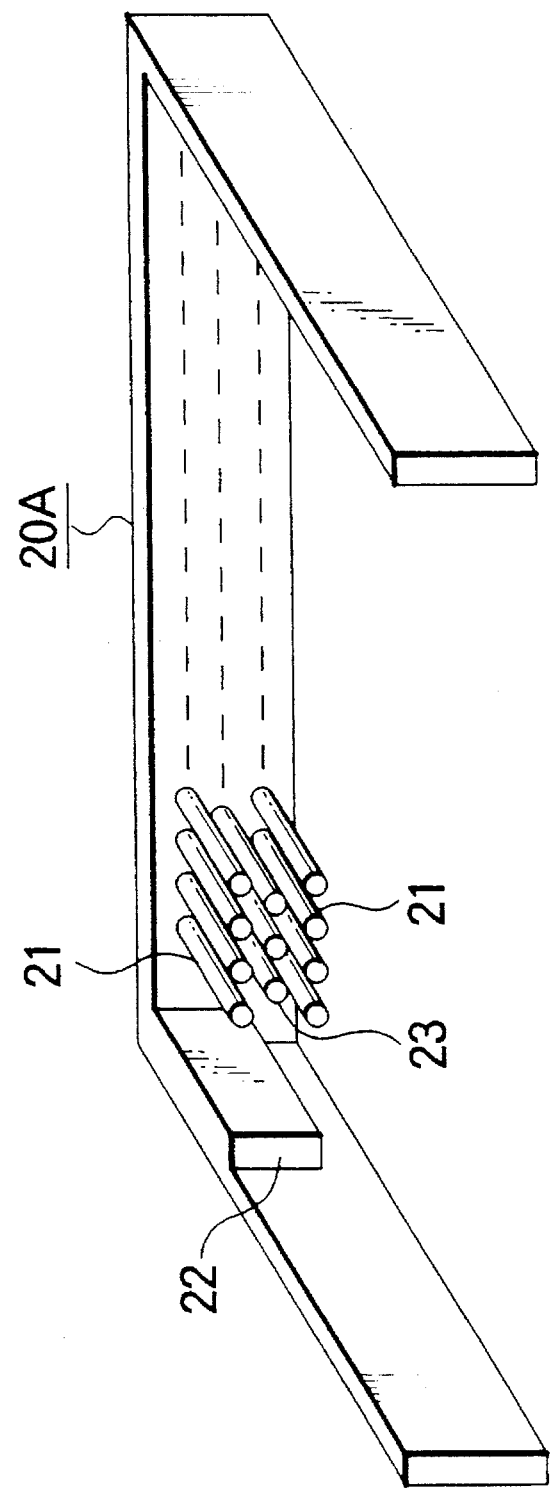
FIG. 4 is a perspective view showing a pin connector of a personal computer to be coupled with the PC card in accordance with the first embodiment of the present invention.

Referring to FIGS. 1, 2, 3, and 4, the first embodiment of the present invention will be described below. FIG. 1 is a perspective view illustrating a PC card in accordance with the first embodiment of the present invention. FIG. 2 is a front view showing a connector surface of the first embodiment of the present invention. FIG. 3 is a block diagram showing the circuitry of the first embodiment of the present invention. FIG. 4 is a perspective view showing a pin connector of a personal computer to be coupled with the first embodiment of the present invention. In the drawings, the same reference numerals denote the same or equivalent components.

In FIGS. 1 and 2, a PC card 1A in accordance with the first embodiment comprises sixty-eight contact holes 5 lined up in two rows of thirty-four contact holes 5 on a connector surface 2 of a socket (not shown) of the PC card 1A, thirty-three contact holes 8 formed on the connector surface 2 and lined up in a row between the upper and lower rows of the contact holes 5, an incorrect insertion prevention ditch 6 formed in one side surface 3 of the housing of the PC card 1A, and an incorrect insertion prevention ditch 7 formed in the other side surface 4 of the housing. The incorrect insertion prevention ditches 6 and 7 are formed on both ends of the connector surface 2 asymmetrically to each other. This is intended to prevent the PC card from being inserted in a pin connector in an incorrect direction as mentioned later.

As illustrated in FIG. 3, the PC card 1A includes circuitry comprising a control input port 10 connected to any of the contact holes 5, an address input port 11 connected to any of the contact holes 5, a mode control circuit 12 for controlling read and write modes, an address decoder 13 for selecting any of the chips constituting a semiconductor memory device that will be described later, an address input buffer 14 for receiving an address, a semiconductor memory device 15A that is a DRAM, a SRAM, a flash memory, or the like and has a storage capacity of, for example, 256 megabytes, a data input/output buffer 16 for inputting or outputting data, and a data input/output port 17 connected to any of the contact holes 5.

In FIG. 3, the circuitry of the PC card 1A further comprises an additional address input port 30 connected to any of the contact holes 8, a multipin interface enable port 31 connected to any of the contact holes 8, an address input buffer with a control gate 32, a buffer 33, and an additional data input/output port 34 connected to any of the contact holes 8.

In FIG. 4, a pin connector (multipin connector) 20A to be coupled with the PC card 1A has sixty-eight contact pins 21 lined up in two rows, an incorrect insertion prevention jut 22, the other incorrect insertion prevention jut that is not shown, and thirty-three contact pins 23 lined up in a row between the two rows of the contact pins 21.

FIG. 3 shows an example of circuitry for enabling the PC card 1A of the first embodiment to operate even through a conventional pin connector (standard pin connector) 20. When the PC card 1A is coupled with the pin connector (multipin connector) 20A of a personal computer, the personal computer sends a low-level signal that is low active through the multipin interface enable port 31 connected to any of the contact holes 8, enables the address input buffer 32 and data input/output buffer 16, activates the additional address input port (pins A26 to A27) 30 and additional data input/output port (pins D16 to D31) 34, and thus sets up the multipin mode (multipin interface). Consequently, the address space in the PC card 1A is expanded from the length of bits A0 to A25 into the length of bits A0 to A27, and the transfer rate is raised from 16 bits to 32 bits. Reading and writing are achieved in the same manner as those in prior art devices. No mention will therefore be made of the reading and writing operating.

When the PC card 1A is coupled with the pin connector (standard pin connector) 20 of a conventional personal computer, pins mated with the additional contact holes 8 are all open (driven high). A high-level signal is therefore sent through the multipin interface enable port 31, whereby the address input buffer 32 and data input/output buffer 16 are disabled, and the additional address input port (A26 to A27) 30 and additional data input/output port (D16 to D31) 34 are inactivated. Consequently, the PC card 1A enters standard pin mode. In other words, when the enable port 31 in the card is pulled up, multipin interface is inactivated, and access through conventional interface is enabled.

In the first embodiment, the contact holes 5 are formed by the same number as the number of the contact pins 21 at the positions coincident with the contact pins 21 of the conventional pin connector (standard pin connector) 20. The PC card therefore can be coupled with the conventional pin connector 20. Furthermore, since the additional contact holes 8 are formed, the PC card can be coupled with the pin connector (multipin connector) 20A having the additional contact pins 23. Consequently, the PC card is adaptable for a personal computer designed to be coupled with the known PC card 1 and for a new personal computer having the pin connector (multipin connector) 20A having a larger number of pins.

In FIG. 3, the additional data input/output port 34 and line linking buffer 33 with the data input/output buffer 16 may not be laid down. Nevertheless, the address space can be expanded.

In FIG. 3, the additional address input port 30, address input buffer 32, and line linking buffer 33 with the address input buffer 32 may not be laid down. Nevertheless, the transfer rate can be expanded.

Second Embodiment

Figure 5:
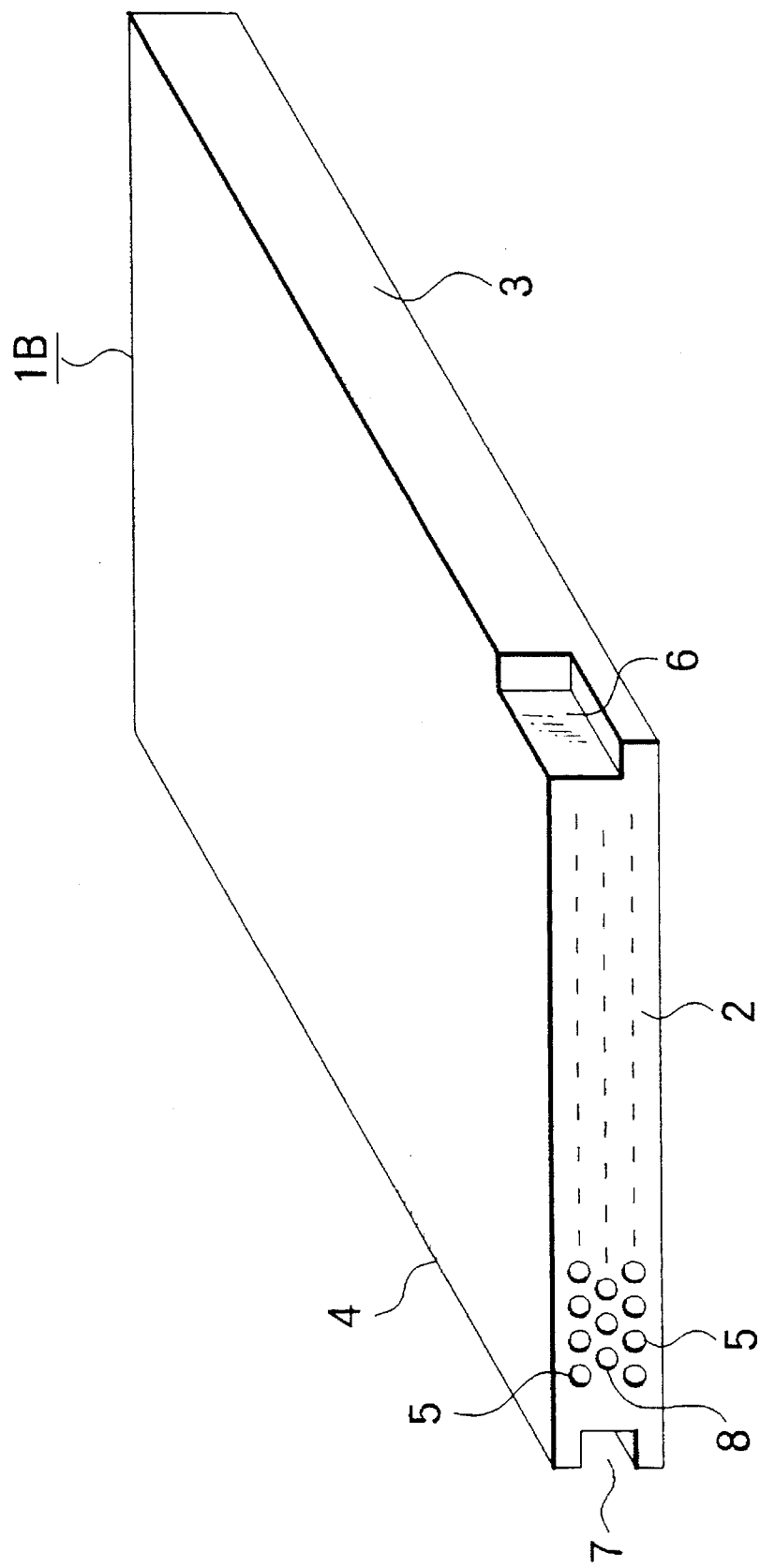
FIG. 5 is a perspective view showing a PC card in accordance with the second embodiment of the present invention.
Figure 6:
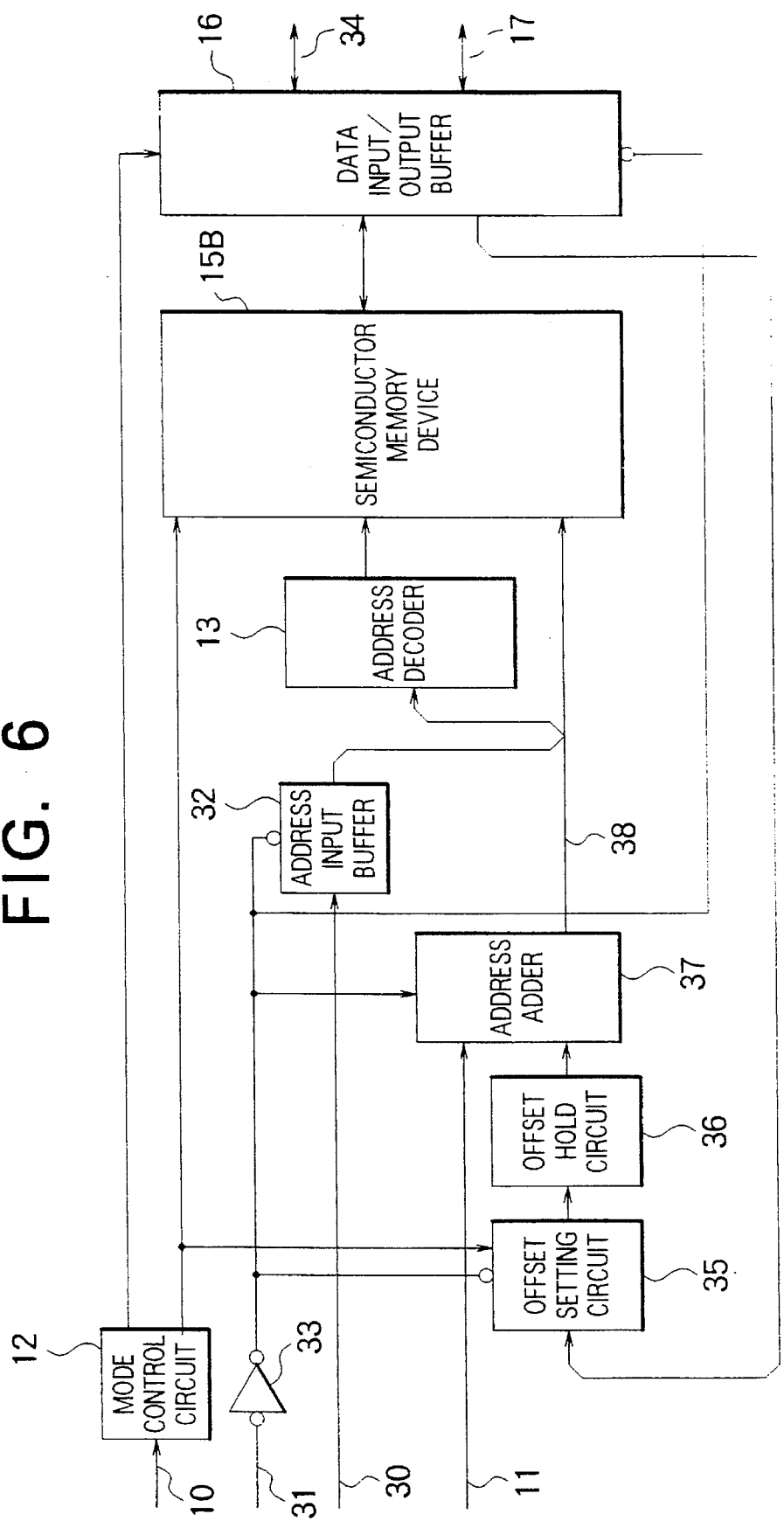
FIG. 6 is a block diagram showing the circuitry of the PC card in accordance with the second embodiment of the present invention.
Figure 7:
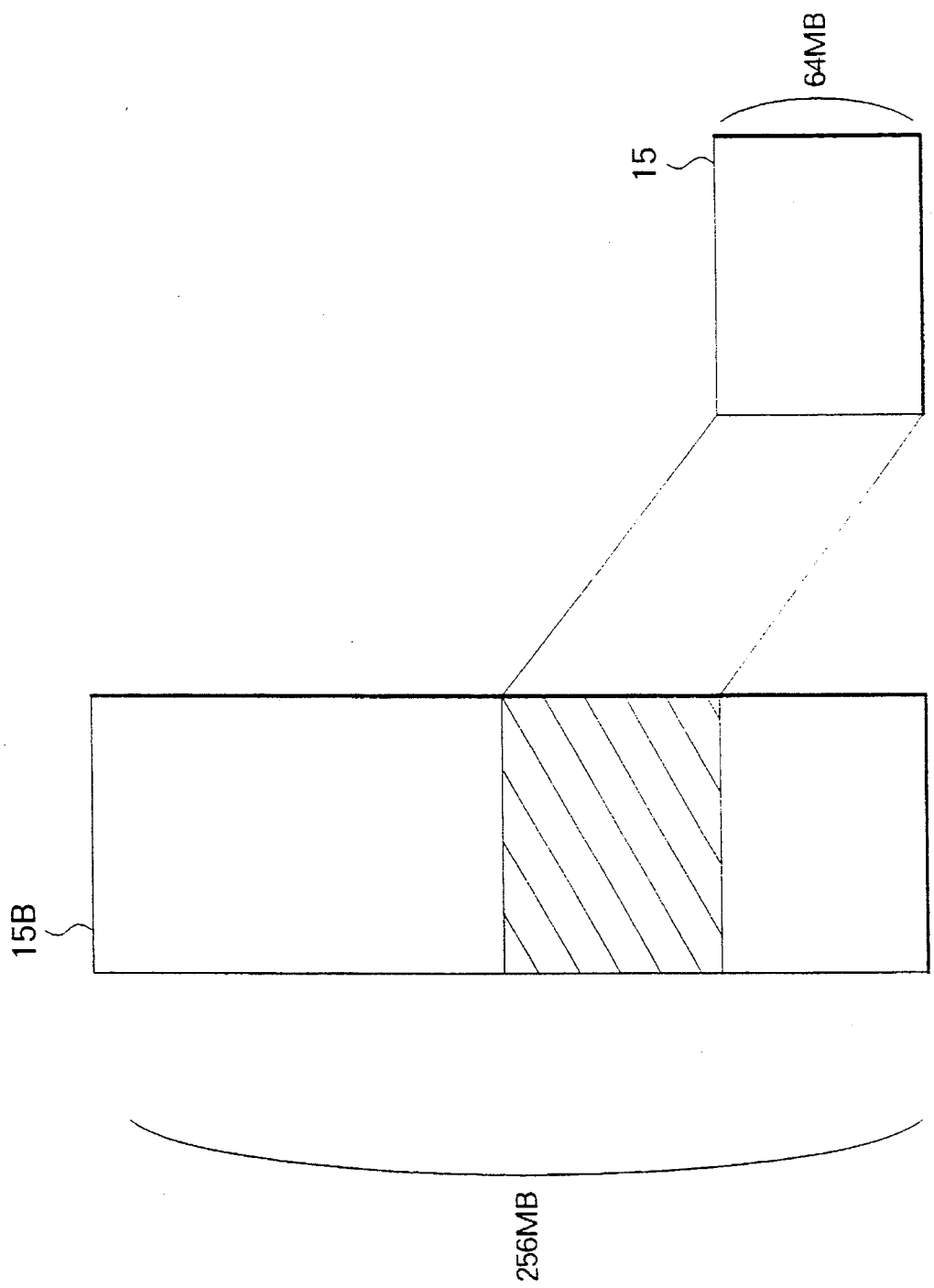
FIG. 7 shows an address space in the PC card in accordance with the second embodiment of the present invention.

Referring to FIGS. 5, 6, and 7, the second embodiment of the present invention will be described. FIG. 5 is a perspective view showing the appearance of a PC card in accordance with the second embodiment of the present invention. FIG. 6 is a block diagram showing the circuitry of the second embodiment of the present invention. FIG. 7 shows an address space in the second embodiment of the present invention.

As illustrated in FIG. 5, a PC card 1B of the second embodiment has the same shape and the same contact holes 5 and 8 as the PC card 1A.

As illustrated in FIG. 6, the PC card 1B includes the circuitry comprising a control input port 10 connected to any of the contact holes 5, an address input port 11 connected to any of the contact holes 5, a mode control circuit 12 for controlling read and write modes, an address decoder 13 for selecting any of the chips constituting a semiconductor memory device, a semiconductor memory device 15B that is a DRAM, SRAM, flash memory, or the like and has, for example, a storage capacity of 256 megabytes, a data input/output buffer 16 for inputting or outputting data, and a data input/output port 17 connected to any of the contact holes 5.

As illustrated in FIG. 6, the circuitry of the PC card 1B further comprises an additional address input port 30 connected to any of the contact holes 8, a multipin interface enable port 31 connected to any of the contact holes 8, an address input buffer with a control gate 32, a buffer 33, and an additional data input/output port 34 connected to any of the contact holes 8.

As illustrated in FIG. 6, the circuitry of the PC card 1B further comprises an offset setting circuit 35 for pre-setting an offset address, an offset hold circuit 35 for retaining the offset address, and an address adder 37 that acts as a simple buffer in standard pin mode and adds up an input address (bits A0 to A25) and the offset address in multipin mode. Reference numeral 38 denotes an inner address bus of the card.

According to the PC card 1B, an address space (64 megabytes in size) accessible by a conventional personal computer can be allotted to any portion of a larger address space (256 megabytes in size) accessible by a new personal computer.

FIG. 7 shows an example of allotment, wherein an address space 15 that is accessible by a conventional personal computer and 64 megabytes in size can be allotted to any uninterrupted portion of 64 megabytes in size within an address space 15B that is accessible by a new personal computer and 256 megabytes in size. To which portion of the 256-megabyte address space 15B for multipin mode the 64-megabyte address space 15 for standard pin mode is allotted is determined with an offset address designated at the time of setting up multipin mode.

FIG. 6 shows an offset circuit added to realize the foregoing function. First, for multipin mode, a personal computer sets up a special offset address setting mode via the control input port 10 and pre-sets an offset address. For example, the offset address is fed to the offset setting circuit 35 via the additional data input/output port 34 and data input/output buffer 16, and then retained by the offset hold circuit 36.

For multipin mode, the PC card 1B is activated with the input of an enable signal through the multipin interface enable port 31. Addresses received through the address input port 11 (pins A0 to A25) and additional address input port 30 (pins A26 and A27) are then placed on the inner address bus 38. The PC card 1B thus operates a 256-megabyte card. At this time, the additional feature of the address adder 37 is disabled. The address adder 37 therefore acts as a simple address buffer.

As mentioned above, since the offset setting circuit 35 is activated in multipin mode, when an offset address for standard pin mode is fed to the offset hold circuit 37 via the data input/output buffer 16, a 64-megabyte address space used in conventional standard pin mode can be allotted to any portion of a 256-megabyte multipin mode space.

In conventional standard pin mode, an enable signal sent through the multipin interface enable port 31 is negated. An address sent through the address input port 11 (pins A0 to A25), and an offset address designated at the time of setting up multipin mode and retained in the offset hold circuit 36 are added up by the address adder 37. The resultant address is placed on the inner address bus 38.

The PC card 1B of the second embodiment can be treated as the known PC card 1 having the storage capacity of 64 megabytes. Specifically, 256-megabyte data written in multipin mode can be read by setting four offsets and then accessing the PC card 1B four times.

When the offset hold circuit 36 is designed to retain only high-order bits (A26 and A27) of an address appended for multipin mode, as shown in FIG. 7, any of four 64-megabyte quarters of the 256-megabyte address space can be selected.

Alternatively, when all address bits (A0 to A27) are retained as an offset address, a 64-megabyte space can be allotted to any portion of the 256-megabyte address space. The offset hold circuit 36 must be realized with a latch that can be backed up using a cell incorporated in the card or nonvolatile memory.

Third Embodiment

Figure 8:
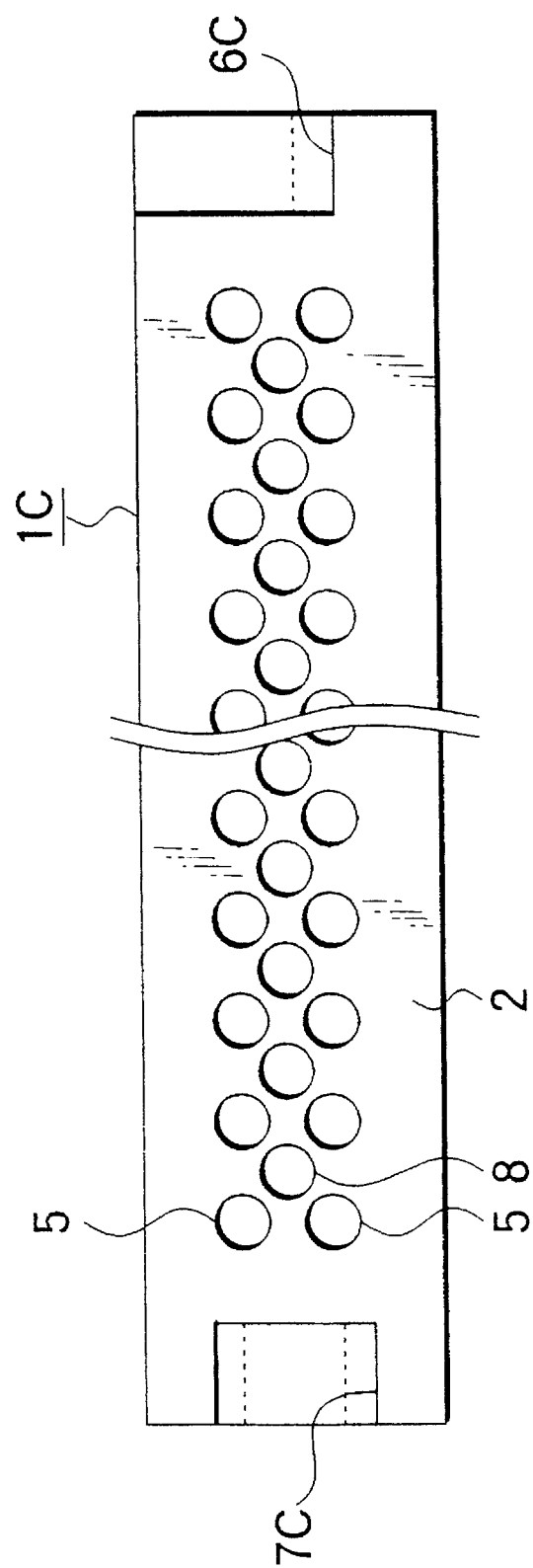
FIG. 8 is a front view showing a connector surface of a PC card in accordance with the third embodiment of the present invention.
Figure 9:
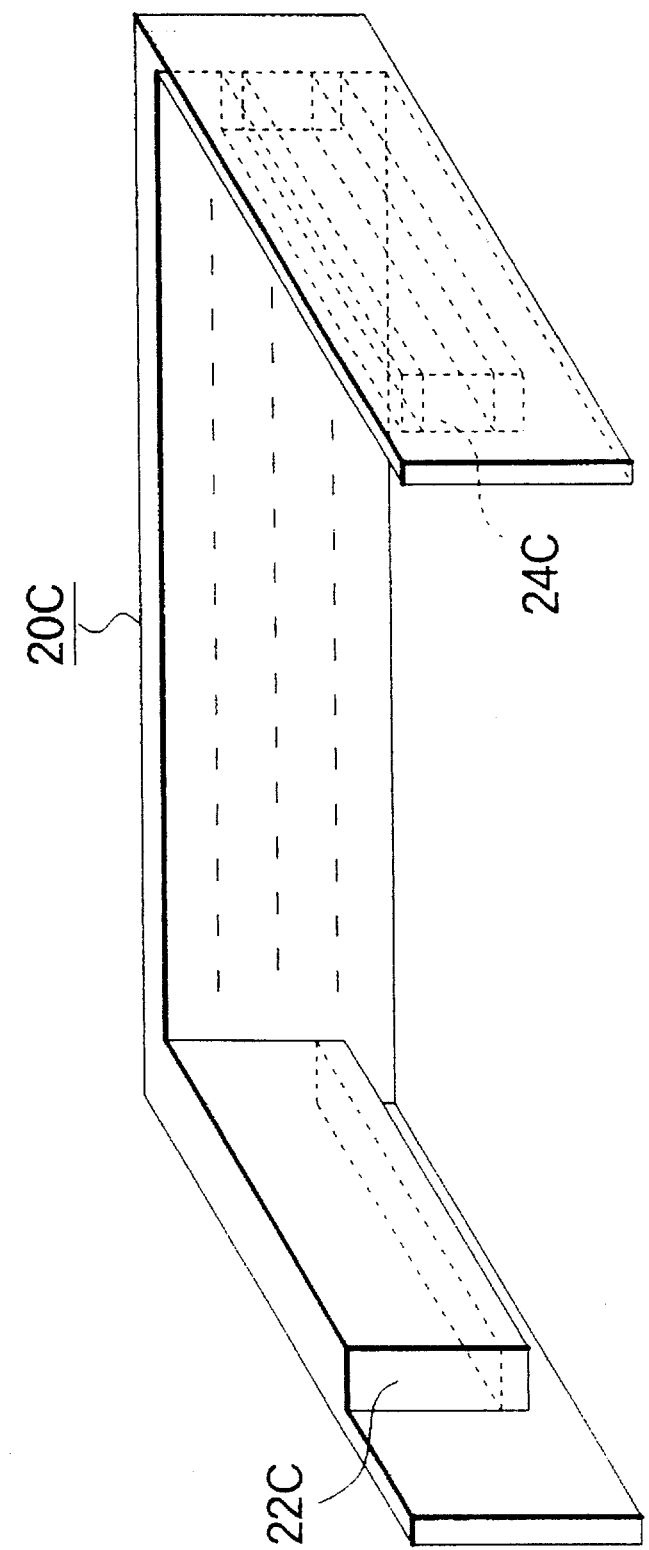
FIG. 9 is a perspective view showing a pin connector of a personal computer to be coupled with the PC card in accordance with the third embodiment of the present invention.

Referring to FIGS. 8 and 9, the third embodiment of the present invention will be described. FIG. 8 is a front view showing a connector surface of the third embodiment of the present invention. FIG. 9 is a perspective view showing a pin connector of a personal computer to be coupled with the third embodiment of the present invention. The circuitry is identical to the one of the first or second embodiment.

In case the known PC card 1 is incorrectly inserted in the pin connector (multipin connector) 20A of a personal computer which is designed to be coupled with the PC card 1A or 1B of the first or second embodiment, the additional contact pins 23 of the pin connector 20A collide with the the portion of the connector surface 2 of the PC card 1 devoid of holes. The pins of the pin connector 20 of the personal computer may therefore be bent.

For taking measures against the drawback, in this portion third embodiment, the shapes of incorrect insertion prevention ditches that have been employed in the past are changed. A PC card 1C of the third embodiment has, as shown in FIG. 8, incorrect insertion prevention ditches 6C and 7C that are larger in the direction of thickness of the card.

Specifically, the incorrect insertion prevention ditches 6C and 7C have larger sectional areas. Accordingly, as shown in FIG. 9, incorrect insertion prevention juts 22C and 24C of the pin connector 20C of a personal computer to be coupled with the PC card 1C have larger sectional areas. Thus, incorrect insertion of the known PC card 1 into the pin connector (multipin connector) 20C can be prevented.

As mentioned above, the sectional areas of the incorrect insertion prevention ditches 6C and 7C of the PC card 1C are made larger than those of the incorrect insertion prevention ditches 6 and 7 of the known PC card 1. The sectional areas of the incorrect insertion prevention juts 22C and 24C of the pin connector 20 to be coupled with the PC card 1C are made larger, accordingly. Consequently, the PC card 1C can be inserted in the pin connector (standard pin connector) 20 of a conventional personal computer. Nevertheless, incorrect insertion of the known PC card 1 into the pin connector (multipin connector) 20C of a new personal computer can be successfully prevented. A PC card system capable of handling a larger number of pins can be constructed.

Fourth Embodiment

Figure 10:
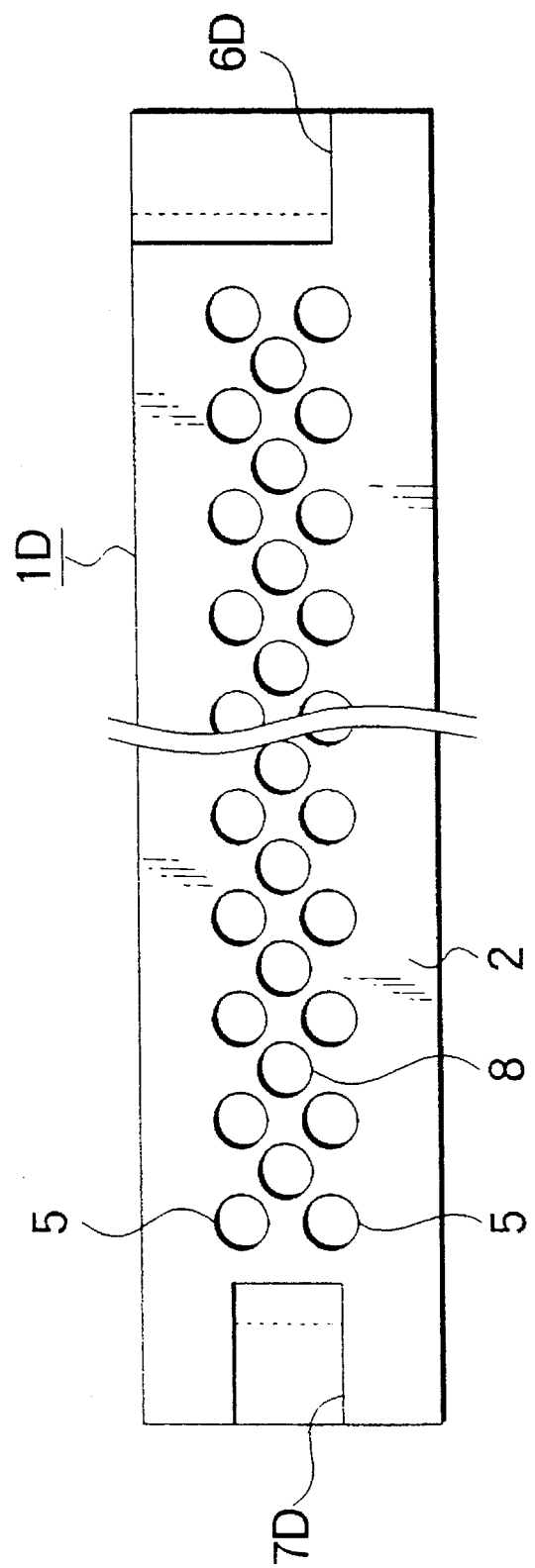
FIG. 10 is a front view showing a connector surface of a PC card in accordance with the fourth embodiment of the present invention.
Figure 11:
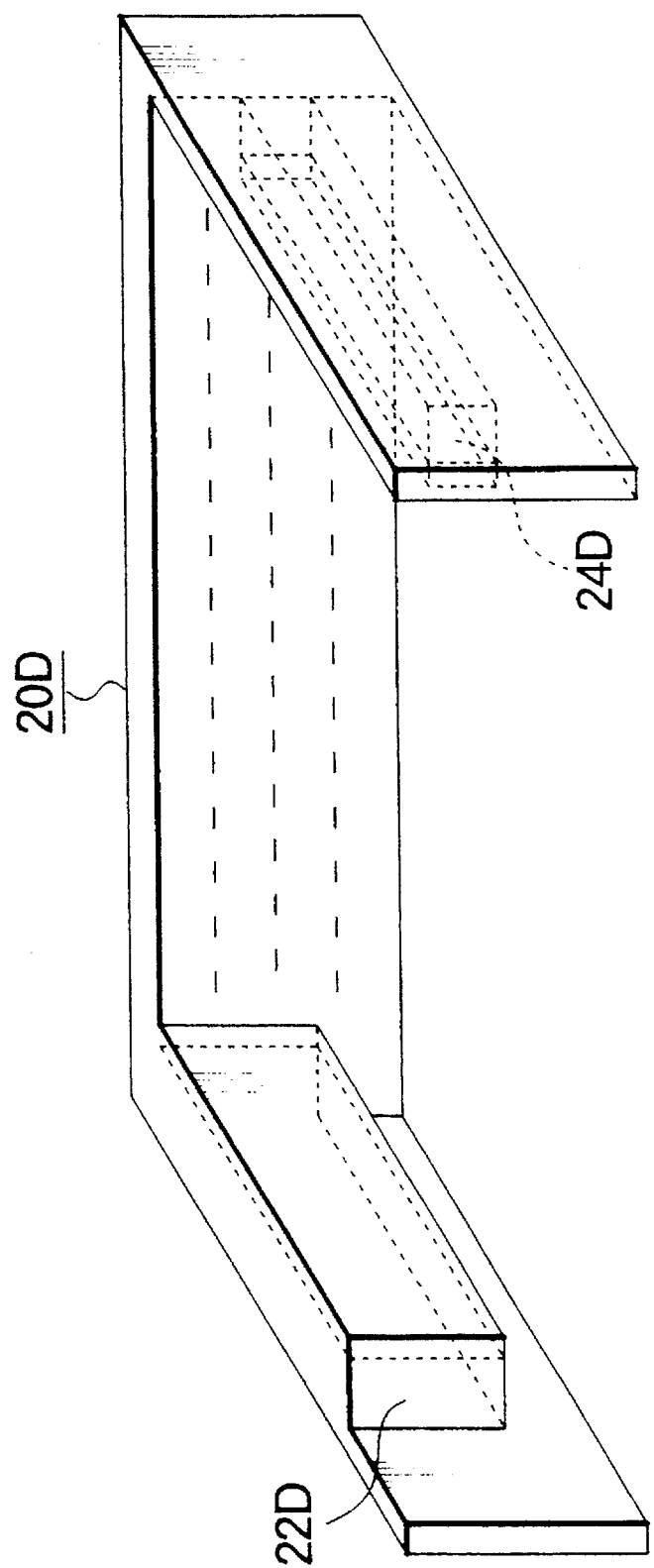
FIG. 11 is a perspective view showing a pin connector of a personal computer to be coupled with the PC card in accordance with the fourth embodiment of the present invention.

Referring to FIGS. 10 and 11, the fourth embodiment of the present invention will be described. FIG. 10 is a front view showing a connector surface of the fourth embodiment of the present invention. FIG. 11 is a perspective view showing a pin connector of a personal computer to be coupled with the fourth embodiment of the present invention. The circuitry is identical to the one of the first or second embodiment.

In an effort to take measures against the aforesaid drawback, similarly to the third embodiment, in the fourth embodiment, the shapes of incorrect insertion prevention ditches that have been employed in the past are changed. A PC card 1D of the fourth embodiment has, as shown in FIG. 10, incorrect insertion prevention ditches 6D and 7D that are larger in the direction of width of the card.

Thus, the incorrect insertion prevention ditches 6D and 7D of the PC card 1D have larger sectional areas than the incorrect insertion prevention ditches 6 and 7 of the known PC card 1. Accordingly, as shown in FIG. 11, the sectional areas of incorrect insertion prevention juts 22D and 24D of a pin connector (multipin connector) 20D to be coupled with the PC card 1C are made larger. Thus, the PC card 1D can be inserted in the pin connector (standard pin connector) 20 of a conventional personal computer, while incorrect insertion of the known PC card 1 in the pin connector 20D of a new personal computer can be prevented. Consequently, a PC card system capable of handling a larger number of pins can be constructed.

Fifth Embodiment

Figure 12:
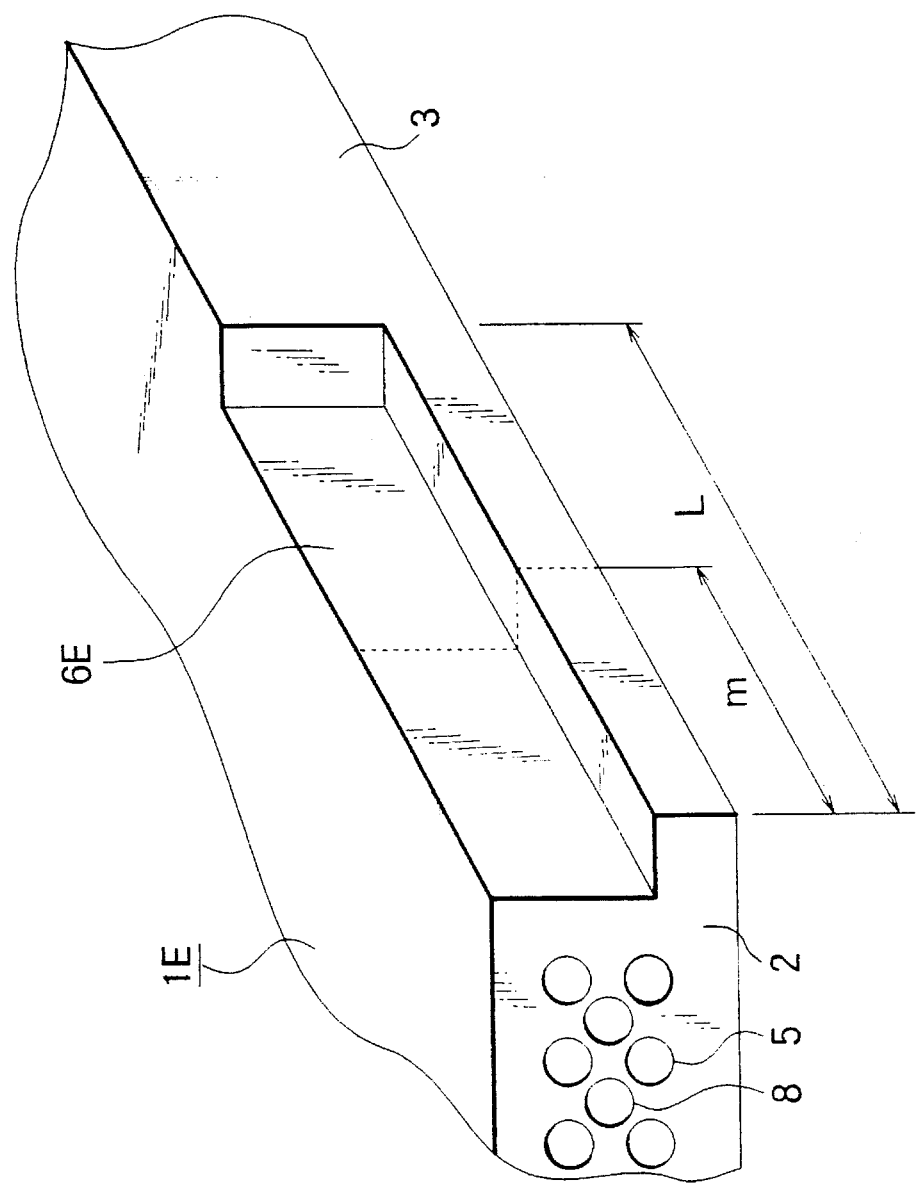
FIG. 12 is a perspective view showing part of a PC card in accordance with the fifth embodiment of the present invention.
Figure 14:
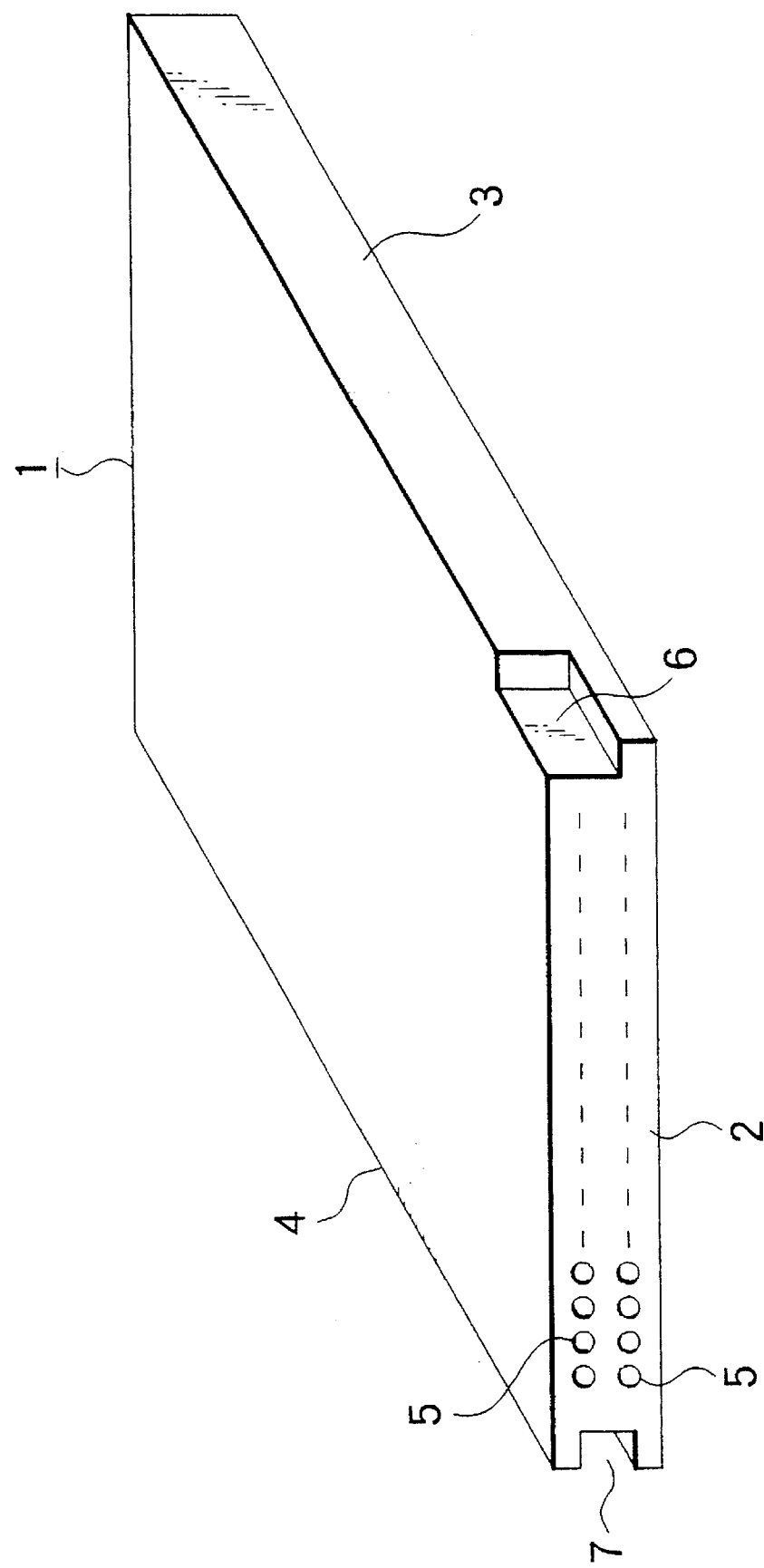
FIG. 14 is a perspective view showing the known PC card.
Figure 15:
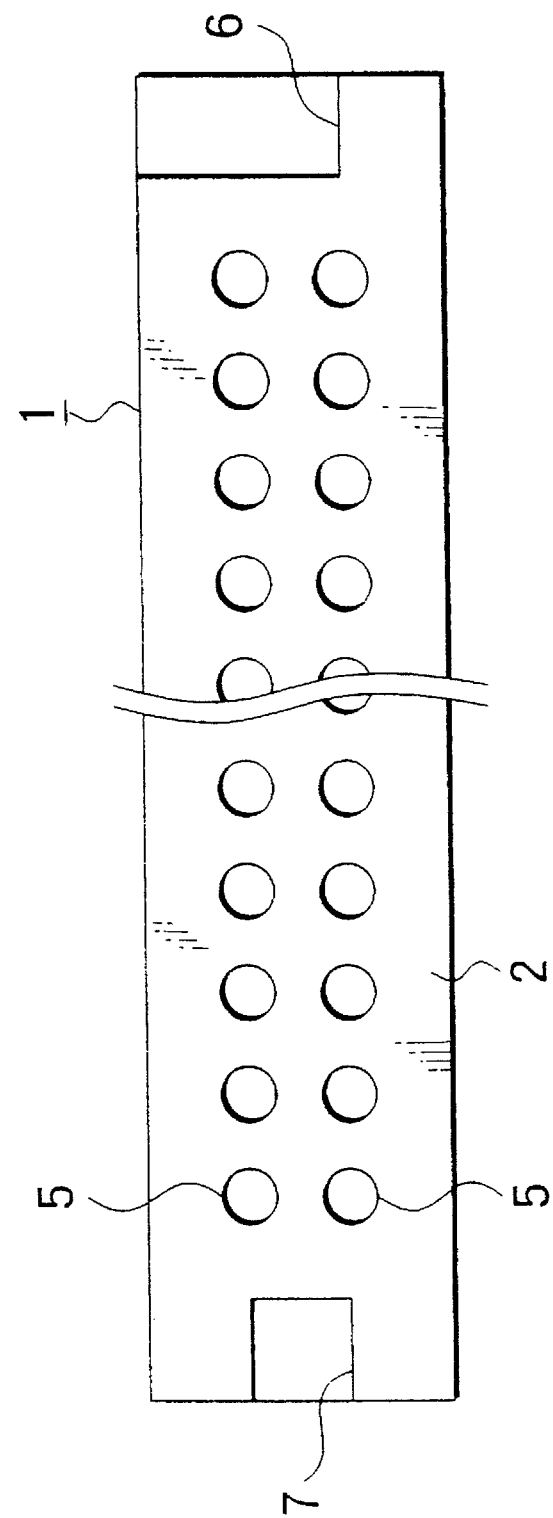
FIG. 15 is a front view showing a connector surface of the known PC card.
Figure 16:
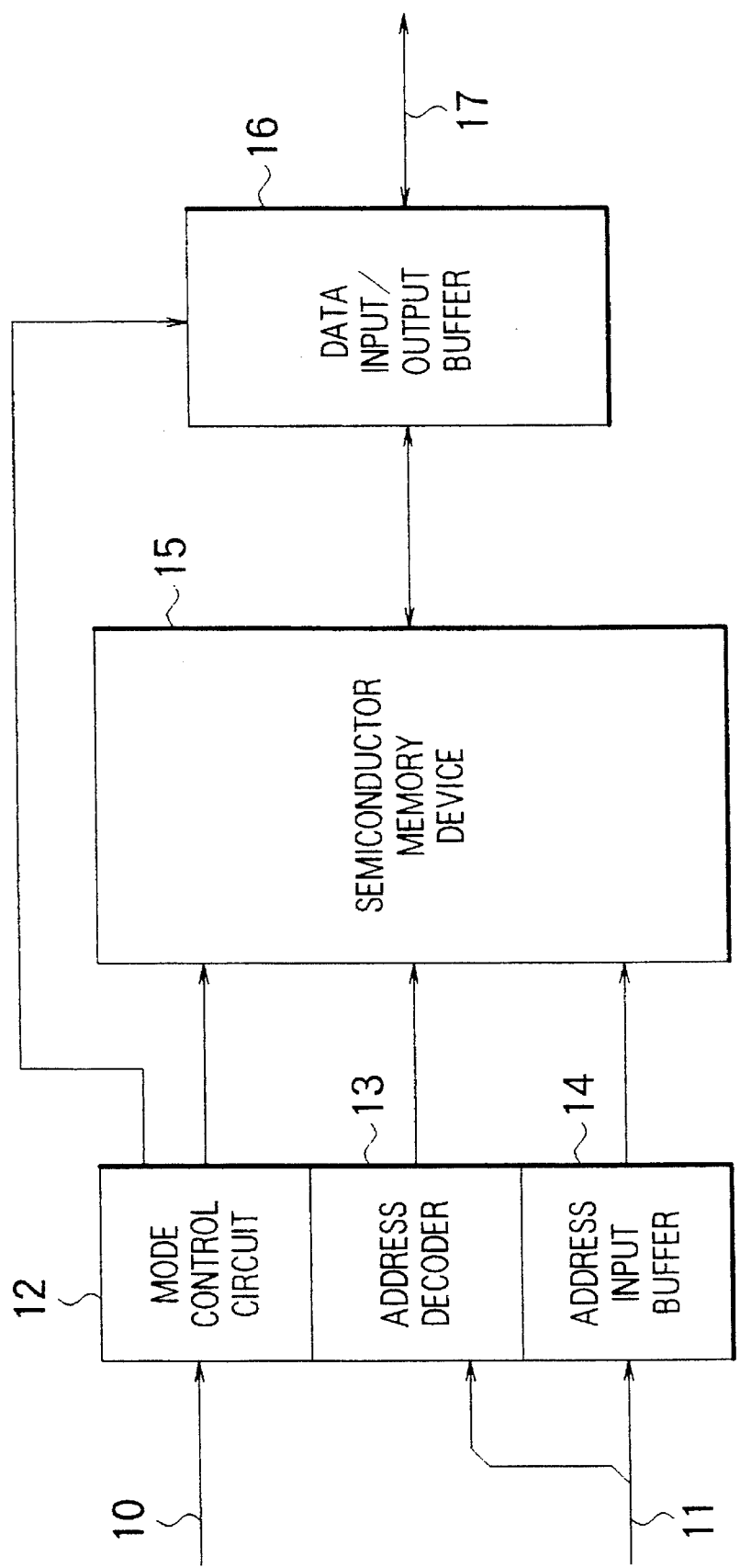
FIG. 16 is a block diagram showing the circuitry of the known PC card.
Figure 17:
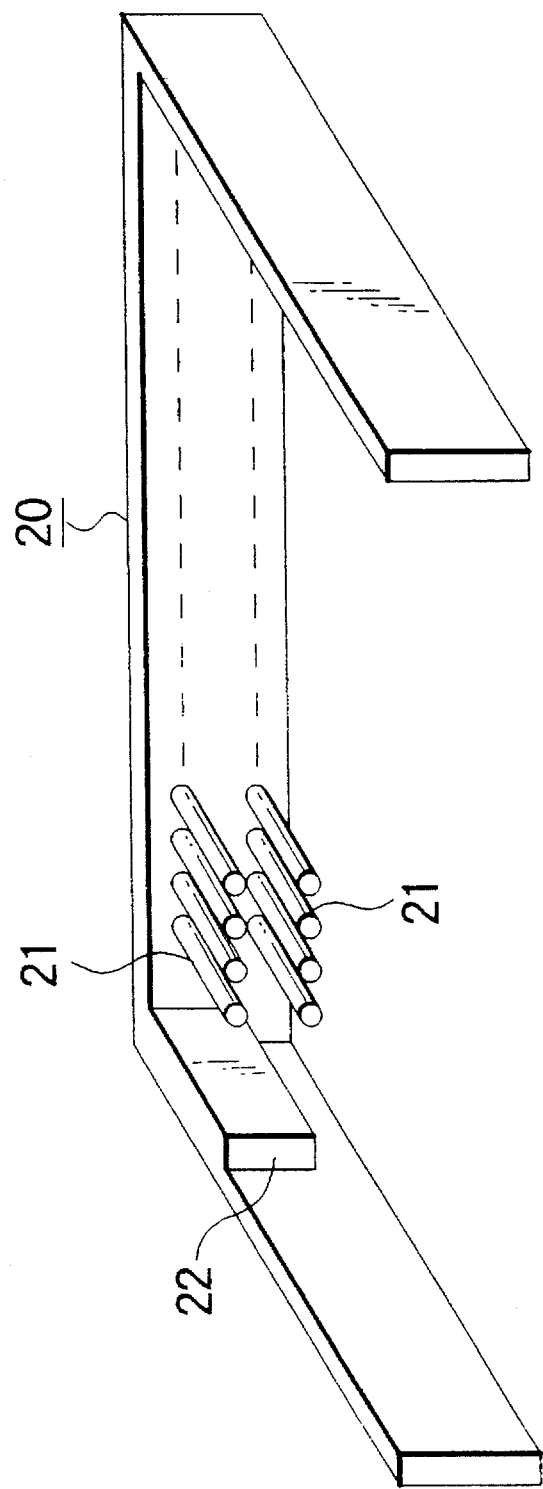
FIG. 17 is a perspective view showing a known pin connector of a personal computer to be coupled with the known PC card.

Referring to FIGS. 12 and 13, the fifth embodiment of the present invention will be described. FIG. 12 is a perspective view showing part of a PC card of the fifth embodiment of the present invention. FIG. 13 is a plan view showing a pin connector of a personal computer to be coupled with the fifth embodiment of the present invention as well as a known PC card. The circuitry is identical to the one of the first or second embodiment.

The fifth embodiment can, similarly to the third and fourth embodiment, prevent pins of a pin connector of a personal computer from being damaged due to incorrect insertion of the known PC card 1. In FIG. 12, an incorrect insertion prevention ditch 6E of a PC card 1E has a depth L that is larger than the depth m of the known PC card 1 (only one (right one) of ditches is shown. The left ditch has the same shape).

FIG. 13 illustrates the situation in which the known PC card 1 is incorrectly inserted in a pin connector (multipin connector) 20E having incorrect insertion prevention juts 22E (24E) that have large depths in conformity with the incorrect insertion prevention ditches 6E having large depths. The depths m of the incorrect insertion prevention ditches 6 and 7 of the known PC card 1 are smaller than the depths L of the incorrect insertion prevention juts 22E and 24E. The known PC card 1 cannot be inserted beyond the position indicated with a dashed line in FIG. 13 in the pin connector (multipin connector) 20E. The PC card 1 will therefore not damage the contact pins 23 of the pin connector 20E. This embodiment has the same advantage as the aforesaid third or fourth embodiment.

What is claimed is:

1. A PC card, comprising:

a housing having side surfaces and a connector surface communicating with said side surfaces;

first contact holes formed on said connector surface and mated with contact pins of a multipin connector and contact pins of a standard pin connector; and second contact holes formed on said connector surface and mated with said contact pins of said multipin connector.

2. The PC card according to claim 1, wherein said first contact holes are lined up in two rows on said connector surface, and said second contact holes are lined up in a row between said upper and lower rows of said first contact holes lined up in two rows.

3. The PC card according to claim 2, further comprising incorrect insertion prevention ditches formed on said side surfaces of said housing.

4. The PC card according to claim 3, further comprising a first incorrect insertion prevention ditch formed on one side surface of said housing, a second incorrect insertion prevention ditch formed on the other side surface of said housing, wherein said first and second incorrect insertion prevention ditches are shaped mutually asymmetrically.

5. The PC card according to claim 4, further comprising:

a mode control circuit for controlling read and write modes;

a data input/output buffer for inputting or outputting data through said first contact holes;

a semiconductor memory device including a plurality of chips for storing the data;

an address input buffer for inputting a first address through said first contact holes and outputting the first address to said semiconductor memory device;

a multipin mode address input buffer for inputting a second address through said second contact holes in a multipin mode; and an address decoder for selecting any of said chips comprising said semiconductor memory device according to high-order bits of the first address in a standard pin mode, and selecting any of said chips comprising said semiconductor memory device according to said high-order bits of the first address as well as the second address in the multipin mode.

6. The PC card according to claim 4, further comprising:

a mode control circuit for controlling read and write modes;

a data input/output buffer for inputting or outputting first data through said first contact holes in a standard pin mode, and inputting or outputting second data through said first and second contact holes in a multipin mode;

a semiconductor memory device including a plurality of chips for storing the first data in the standard pin mode, and storing the second data in the multipin mode;

an address input buffer for inputting an address through said first contact holes and outputting said address to said semiconductor memory device; and an address decoder for selecting any of said chips comprising said semiconductor memory device according to high-order bits of said address.

7. The PC card according to claim 4, further comprising:

a mode control circuit for controlling read and write modes;

a data input/output buffer for inputting or outputting first data through said first contact holes in a standard pin mode and for inputting or outputting second data through said first and second contact holes in a multipin mode;

a semiconductor memory device including a plurality of chips, storing the first data in the standard pin mode, and storing the second data in the multipin mode;

an address input buffer for inputting a first address through said first contact holes and outputting the first address to said semiconductor memory device;

a multipin mode address input buffer for inputting the second address through said second contact holes in the multipin mode; and an address decoder for selecting any of said chips comprising said semiconductor memory device according to high-order bits of the first address in the standard pin mode, and selecting any of said chips comprising said semiconductor memory device according to said high-order bits of the first address as well as the second address in the multipin mode.

8. The PC card according to claim 4, further comprising:

a mode control circuit for controlling read and write modes;

a data input/output buffer for inputting or outputting first data through said first contact holes in a standard pin mode, and inputting or outputting second data through said first and second contact holes in a multipin mode;

a semiconductor memory device including a plurality of chips for storing the first data in the standard pin mode, and for storing the second data in the multipin mode;

an offset circuit, which in the standard pin mode, inputs an first address through said first contact holes, outputs the first address to said semiconductor memory device, and adds the retained offset address to the first address, and which in the multipin mode, inputs the first address through said first contact holes, outputs the first address to said semiconductor memory device, and inputs a second address through said second contact holes; and an address decoder for selecting any of said chips constituting said semiconductor memory device according to high-order bits of an address resulting from the addition in the standard pin mode, and selecting any of said chips comprising said semiconductor memory device according to said high-order bits of the first address as well as the second address in the multipin mode.

9. The PC card according to claim 4, wherein said first and second incorrect insertion prevention ditches are larger than incorrect insertion prevention ditches of a PC card that can be coupled with said standard pin connector alone.

10. The PC card according to claim 9, wherein the sectional areas of said first and second incorrect insertion prevention ditches are larger than those of incorrect insertion prevention ditches of a PC card that can be coupled with said standard pin connector alone.

11. The PC card according to claim 9, wherein the sectional areas of said first and second incorrect insertion prevention ditches are larger in the direction of thickness of said card than those of incorrect insertion prevention ditches of a PC card that can be coupled with said standard pin connector alone.

12. The PC card according to claim 11, further comprising:

a mode control circuit for controlling read and write modes;

a data input/output buffer for inputting or outputting first data through said first contact holes in a standard pin mode, and inputting or outputting second data through said first and second contact holes in a multipin mode;

a semiconductor memory device including a plurality of chips for storing the first data in the standard pin mode, and storing the second data in the multipin mode;

an address input buffer for inputting a first address through said first contact holes and outputting the first address to said semiconductor memory device;

a multipin mode address buffer for inputting a second address through said second contact holes in the multipin mode; and an address decoder for selecting any of said chips comprising said semiconductor memory device according to high-order bits of the first address in the standard pin mode, and selecting any of said chips comprising said semiconductor memory device according to said high-order bits of the first address as well as the second address.

13. The PC card according to claim 10, wherein the sectional areas of said first and second incorrect insertion prevention ditches are larger in the direction of the width of said PC card than those of incorrect insertion prevention ditches of a PC card that can be coupled with said standard pin connector alone.

14. The PC card according to claim 13, further comprising:

a mode control circuit for controlling read and write modes;

a data input/output buffer for inputting or outputting first data through said first contact holes in a standard pin mode, and inputting or outputting second data through said first and second contact holes in a multipin mode;

a semiconductor memory device including a plurality of chips, storing the second data in the multipin mode;

an address input buffer for inputting a first address through said first contact holes and outputting the first address to said semiconductor memory device;

a multipin mode address buffer for inputting a second address through said second contact holes in the multipin mode; and an address decoder for selecting any of said chips comprising said semiconductor memory device according to high-order bits of the first address in the standard pin mode, and selecting any of said chips comprising said semiconductor memory device according to said high-order bits of the first address as well as the second address.

15. The PC card according to claim 9, wherein the depths in the longitudinal direction of said card of said first and second incorrect insertion prevention ditches are larger than those of incorrect insertion prevention ditches of a PC card that can be coupled with said standard pin connector alone.

16. The PC card according to claim 15, further comprising:

a mode control circuit for controlling read and write modes;

a data input/output buffer for inputting or outputting first data through said first contact holes in a standard pin mode and for inputting or outputting second data thorough said first and second contact holes in a standard pin mode and for inputting or outputting second data through said first and second contact holes in a multipin mode;

a semiconductor memory device including a plurality of chips for storing the first data in the standard pin mode, and storing the second data in the multipin mode;

an address input buffer for inputting a first address through said first contact holes and outputting the first address to said semiconductor memory device;

a multipin mode address buffer for inputting a second address through said second contact holes in the multipin mode; and an address decoder for selecting any of said chips comprising said semiconductor memory device according to high-order bits of the first address in the standard pin mode, and selecting any of said chips comprising said semiconductor memory device according to said high-order bits of the first address as well as the second address.

* * * * *